United States Patent

Gardner et al.

[11] Patent Number: 5,808,319
[45] Date of Patent: Sep. 15, 1998

[54] LOCALIZED SEMICONDUCTOR SUBSTRATE FOR MULTILEVEL TRANSISTORS

[75] Inventors: Mark I. Gardner, Cedar Creek; Daniel Kadosh, Austin, both of Tex.

[73] Assignee: Advanced Micro Devices, Inc.

[21] Appl. No.: 728,601

[22] Filed: Oct. 10, 1996

[51] Int. Cl.[6] .......................... H01L 29/76; H01L 31/076; H01L 31/20
[52] U.S. Cl. .............................. 257/67; 257/777; 257/506
[58] Field of Search ..................................... 757/777, 501, 757/506, 350, 347, 67

[56] References Cited

U.S. PATENT DOCUMENTS

| | | | |
|---|---|---|---|
| 5,006,913 | 4/1991 | Sugahara et al. | 257/67 |
| 5,473,181 | 12/1995 | Schwalke et al. | 257/350 |

FOREIGN PATENT DOCUMENTS 58-175853  10/1983  Japan ........................ 257/67

Primary Examiner—Mahshid D. Saadat
Assistant Examiner—S. V. Clark
Attorney, Agent, or Firm—Kevin L. Daffer; Conley, Rose & Tayon

[57] ABSTRACT

A dual level transistor integrated circuit and a fabrication technique for making the integrated circuit. The dual level transistor is an integrated circuit in which a first transistor is formed on an upper surface of a global dielectric and a second transistor is formed on an upper surface of a first local substrate such that the second transistor is vertically displaced from the first transistor. The first local substrate is formed upon a first inter-substrate dielectric. By vertically displacing the first and second transistors, the lateral separation required to isolate first and second transistors in a typical single plane process is eliminated. The integrated circuit includes a semiconductor global substrate. The integrated circuit further includes a first transistor. The first transistor includes a first gate dielectric formed on an upper surface of the global substrate and a first conductive gate structure formed on an upper surface of the first dielectric. The integrated circuit further includes a first inter-substrate dielectric that is formed on the first conductive gate structure and the global substrate. A first local substrate is formed on an upper surface of the first inter-substrate dielectric. A second transistor is located within the first local substrate. The second transistor includes a second gate dielectric formed on an upper surface of the first local substrate and a second conductive gate structure formed on an upper surface of the second gate dielectric.

6 Claims, 3 Drawing Sheets

LOCALIZED SEMICONDUCTOR SUBSTRATE FOR MULTILEVEL TRANSISTORS

BACKGROUND OF THE INVENTION

1. Field of the Invention

The present invention relates to the field of semiconductor processing, and more particularly to a method for increasing transistor density in an integrated circuit by using multiple layers of transistors formed on localized substrates.

2. Description of the Related Art

Integrated circuits are widely employed in a variety of electronics applications to produce complex electronics circuits on an extremely small area of a monolithic semiconductor substrate such as silicon. Universally recognized for their low cost, high speed, low power dissipation, and high reliability, semiconductor integrated circuits long ago replaced discreet components as the predominant and preferred electronic devices and world-wide sales of integrated circuits have increased exponentially since the early 1960s. During this time, semiconductor manufacturers have strived to reduce the cost and increase the complexity of integrated circuits by fabricating a larger number of transistors in a given area of the semiconductor substrate. The primary means of achieving these goals has been reducing the size of the individual transistors that comprise the integrated circuit. Smaller transistors enable the fabrication of more complex and smaller devices. Smaller devices have the dual benefits of increasing the number of devices manufacturable on a single semiconductor wafer and increasing the probability that any individual device on a given silicon wafer will be free of random fatal defects. Since the early 1960's, when the average feature size or design rule within the industry was approximately 25 microns, the average design rule has decreased rather steadily by approximately 11% per year. The average design rule dropped below one micron in the mid 1980's, and has been decreasing steadily since then.

In addition to the size of the transistors themselves, the amount of area required to isolate individual transistors from one another limits the transistor density (i.e., the number of transistors per unit area). Referring to FIG. 1, a conventional integrated circuit is shown in which a first transistor 10 and a second transistor 12 are fabricated on a semiconductor substrate 8. To isolate first transistor 10 from second transistor 12, an isolation structure such as shallow trench isolation structure 14 is required to prevent the inadvertent coupling of source/drain regions 16 of first transistor 10 and source/drain region 18 of second transistor 12. The lateral dimension $d_L$ of an isolation structure such as shallow trench isolation structure 14 limits the density of transistors that can be fabricated over a given area of substrate 8. As a rule of thumb, the minimum lateral dimension $d_L$ necessary to adequately ensure proper isolation between source/drain region 16 of first transistor 10 and source/drain region 18 of second transistor 12 is approximately equal to the lateral dimension $L_t$ of first transistor 10. Shallow trench isolation structure 14 occupies a region of substrate 8 that could otherwise be devoted to the formation of active transistors and represents a limitation on the achievable transistor density. It would, therefore, be highly desirable to implement a circuit design and fabrication technique to reduce or eliminate the percentage of substrate 8 occupied by isolation regions 14.

SUMMARY OF THE INVENTION

The problems identified above are in large part addressed by a multi-level integrated circuit and a fabrication technique for making the integrated circuit through the use of one or more localized substrates. The integrated circuit includes a first transistor formed on an upper surface of a global substrate and a second transistor formed on an upper surface of a first local substrate such that the second transistor is vertically displaced from the first transistor. The first local substrate is formed upon a first inter-substrate dielectric isolating the first transistor from the first local substrate. By vertically displacing the first and second transistors, the lateral separation required to isolate the first and second transistors is substantially reduced or eliminated. This circuit and process can be extended to encompass more than two levels of transistors wherein each subsequent transistor is formed upon a subsequent inter-substrate dielectric/ local substrate pair.

Broadly speaking, the present invention contemplates a local substrate for a multi-level integrated circuit. The local substrate comprises a semiconductor material formed on a first transistor level of the integrated circuit. The local substrate is suitable for forming a second transistor level vertically displaced with respect to said first transistor level. Preferably, the local substrate includes a first transistor and an inter-substrate dielectric isolating said first transistor from said local substrate. In a presently preferred embodiment, the semiconductor material comprises polycrystalline silicon having an average grain size greater than approximately 3000 angstroms. The local substrate is preferably approximately 1 to 8 microns thick.

The present invention still further contemplates a semiconductor fabrication process, in which a local substrate is formed on a first transistor level of an integrated circuit. The local substrate comprises a semiconductor material and is suitable for forming a second transistor level of said integrated circuit. In a preferred embodiment, the first transistor level includes a first transistor and an inter-substrate dielectric isolating said first transistor from said local substrate. The local substrate is preferably formed by chemical vapor depositing a silicon bearing film on the said first transistor level. The deposition is performed at a preferred temperature less than approximately 580° C. to form an amorphous silicon film. Thereafter, the amorphous silicon film is annealed to form polycrystalline silicon from the amorphous film. The anneal is preferably accomplished at a temperature of approximately 400° to 1000° C. for a duration of 2 to 24 hours. The presently preferred process produces a polycrystalline silicon film having an average grain size greater than approximately 3000 angstroms.

BRIEF DESCRIPTION OF THE DRAWINGS

Other objects and advantages of the invention will become apparent upon reading the following detailed description and upon reference to the accompanying drawings in which.

Figure 1:
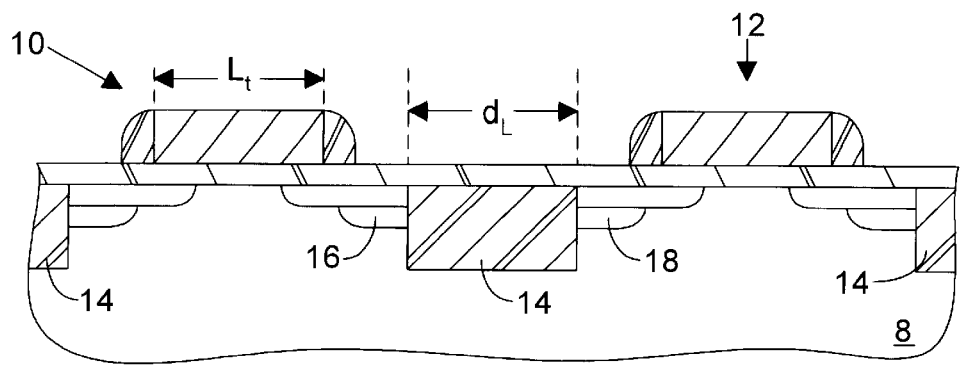
FIG. 1 is a partial cross-sectional view of an integrated circuit in which a first transistor and a second transistor are laterally displaced by an isolation structure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
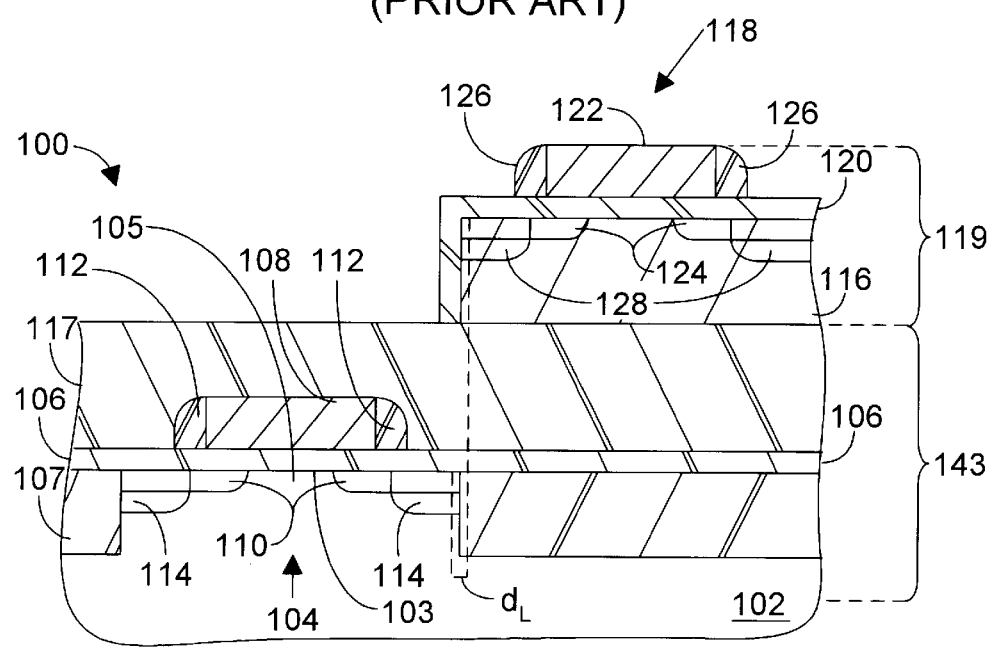
FIG. 2 is a partial cross-sectional view of an integrated circuit in which a first transistor and a second transistor are vertically displaced.

Turning now to the drawings, FIG. 2 shows an integrated circuit 100 according to the present invention. Integrated circuit 100 includes a global substrate 102 formed on first transistor level 143 of integrated circuit 100. Preferably, first transistor level 143 includes first transistor 104 and first inter-substrate dielectric 117. Global substrate 102 is a semiconductor material preferably comprised of a p+ silicon bulk (not shown in the drawing) and a p– epitaxial layer extending from the p+ bulk to upper surface 103 of global substrate 102. Preferably, a resistivity of the p– epitaxial layer is approximately 10 to 15 Ω-cm. Integrated circuit 100 further includes first transistor 104. First transistor 104 includes a first gate dielectric layer 106 formed on upper surface 103 of global substrate 102 and a first conductive gate structure 108, which is formed on an upper surface of first gate dielectric 106. In the embodiment shown in FIG. 2, first transistor 104 further includes lightly doped source/drain regions 110, heavily doped source/drain regions 114, and spacer structures 112. First gate dielectric layer 106 preferably comprises a thermal oxide having a thickness of approximately 20 to 200 angstroms. In the presently preferred embodiment, first conductive gate structure 108 includes chemically vapor deposited polysilicon that has been doped to produce a sheet resistivity less than approximately 500 Ω/sq.

A channel region 105 located in global substrate 102 below first conductive gate structure 108 may comprise one or more impurity distributions such as a well impurity distribution, a punchthrough impurity distribution, or a threshold adjust impurity distribution, all as shown and described in greater detail in FIG. 3. It will be appreciated that, although only one first transistor 104 is shown formed within global substrate 102, the present invention contemplates a global substrate in which a plurality of such first transistors 104 are formed. To isolate each first transistor 104 formed within global substrate 102, isolation structures such as shallow trench isolation structure 107 are formed in global substrate 102. It is further contemplated, in a CMOS embodiment of the present invention, that one or more of the plurality of first transistors 104 may be of the n-channel variety while one or more other such transistors 104 can be of a p-channel type. In such a CMOS embodiment, appropriate masking steps may be required to produce separate source/drain impurity distributions as well as separate well, punchthrough, and adjust impurity distributions within global substrate 102. Spacer structures 112 are included in an embodiment of the present invention in which lightly doped drain (LDD) structures are desirable. Lightly doped drain processes, well known in the field, include a two implant, source/drain formation process designed to reduce the maximum E-field that occurs when the drain-to-substrate junction is heavily reverse biased. Reduction of the maximum E-field reduces the occurrence of undesirable hot electron injection into channel region 105 and possibly through first gate dielectric 106 to first conductive gate structure 108.

Integrated circuit 100 further includes first inter-substrate dielectric 117. First inter-substrate dielectric 117 is formed over the topography defined by first conductive gate structure 108 upon global substrate 102. As shown in the drawing, the topography upon which inter-substrate dielectric 117 is formed may include spacer structures 112 and possibly a first gate dielectric 106 as well. First inter-substrate dielectric 117 electrically insulates first conductive gate structure 108 of first transistor 104 from subsequently formed structures as well as providing a physical base upon which subsequent structures may be fabricated. In one preferred embodiment, first inter-substrate dielectric 117 comprises an oxide material such as a chemically vapor deposited oxide formed from a silane or TEOS source. In an alternative embodiment, first inter-substrate dielectric 117 may comprise a silicon nitride layer or possibly a combined layer of silicon nitride and oxide. In a preferred embodiment, first inter-substrate dielectric 117 has a thickness of approximately 0.5 to 15.0 microns. The wide range of an acceptable thickness for first inter-substrate dielectric 117 accommodates multiple processing applications. Thicker dielectric layers are preferred for embodiments in which it is desired to minimize capacitive coupling between adjacent transistor levels, whereas thinner dielectrics may shorten the deposition process or simplify subsequent processing such as via formation. First inter-substrate dielectric 117 isolates first transistor 104 from structures formed on first inter-substrate dielectric 117. By vertically displacing the subsequently formed structures, integrated circuit 100 can tolerate a significant reduction or possibly an elimination of the lateral isolation typically required in conventional single level transistors.

Integrated circuit 100 further includes first local substrate 116 formed on an upper surface of first inter-substrate dielectric 117. First local substrate 116 is a semiconductor material preferably comprising polycrystalline silicon. Local substrate 116 is suitable for forming a second transistor level of integrated circuit 100. As discussed in greater detail below, a grain size of the polycrystalline silicon within the preferred embodiment of first local substrate 116 is approximately as large as the channel length of second transistor 118. Larger grain size polysilicon is preferred because of its lower resistivity and its higher occurrence of free charge. Smaller grain size polysilicon films become fully depleted of carriers more easily than larger grain size film, possibly resulting in a dramatic increase in resitivity. Because first local substrate 116 will serve as the substrate for one or more subsequently formed transistors 118, it is desirable that the polysilicon within first local substrate 116 approximate the electrical properties of single crystal silicon to the greatest extent possible.

Second transistor 118 includes a second gate dielectric 120, preferably a thermally formed oxide film of approximately 20 to 200 angstroms in thickness, and a second conductive gate structure 122 formed on an upper surface of second gate dielectric 120. Like its counterpart in first transistor 104, second conductive gate structure 122 is preferably comprised of heavily doped CVD polysilicon. Second transistor 118 further includes source/drain impurities laterally spaced on either side of second conductive gate structure 122 within an upper region of first local substrate 116. In the embodiment shown in FIG. 2, the second transistor source/drain impurities include lightly doped source/drain regions 124 and heavily doped source/drain regions 128. In conjunction with the formation of lightly doped impurity distributions 124, second transistors 118 includes spacer structures 126 formed on side-walls of second conductive structure 122. As shown in greater detail in FIG. 7, first local substrate 116 may include various impurity distributions including a second well impurity distribution 132, a second punchthrough impurity distributions 134, and a second adjust impurity distribution 136. It is to be understood that second transistor 118 is but one of a plurality of transistors formed on or within first local substrate 116. Additional transistors (not shown in the drawing) can be easily incorporated into first local substrate 116 as will be appreciated by those skilled in the art of semiconductor processing. Moreover, it will be appreciated that one or more of the second transistors 118 formed within or upon first local substrate 116 may be of the n-channel variety, while one or more other of the second transistors 118 may comprise transistors of the p-channel type. It will further be appreciated that appropriate masking steps and implant steps are required in embodiments in which it is desired to form both n-channel and p-channel second transistors 118 upon first local substrate 116. Second transistor 118 is vertically displaced from first transistor 104. Source/drain region 114 of first transistor 104 is effectively isolated from source/drain region 128 of second transistor 118 by first inter-substrate dielectric layer 117. Because the isolation of the first and second source/drain regions is effectively vertical, the lateral displacement $d_L$ between source/drain region 114 of first transistor 104 and source/drain region 128 of second transistor 118 can be dramatically reduced (i.e. $d_L < L_t/10$) or possibly eliminated. The reduction or elimination of lateral displacement $d_L$ between first transistor 104 and second transistor 118 permits the formation of higher density integrated circuits than is possible with a conventional single plane, transistor fabrication process. In the presently preferred embodiment, a thickness of first local substrate 116 is approximately 1 to 8 microns.

It will be appreciated that the present invention may be easily extended to encompass more than two levels of transistors. More specifically, integrated circuit 100 may include subsequent transistor levels such that integrated circuit 100 comprises three or more transistor levels. Each transistor level formed subsequently to the formation of first transistor 108 will include a local substrate (similar to local substrate 116) formed on an upper surface of the inter-substrate dielectric, and a transistor (similar to second transistor 118). The transistor includes a gate dielectric formed on an upper surface of the local substrate and a gate conductor structure formed on an upper surface of the gate dielectric. Accordingly, the transistor is vertically displaced from a transistor on the preceding transistor level. In this manner, one or more subsequent transistor levels, identified by reference numeral 119 in the drawing, may be included within integrated circuit 100.

Figure 3:
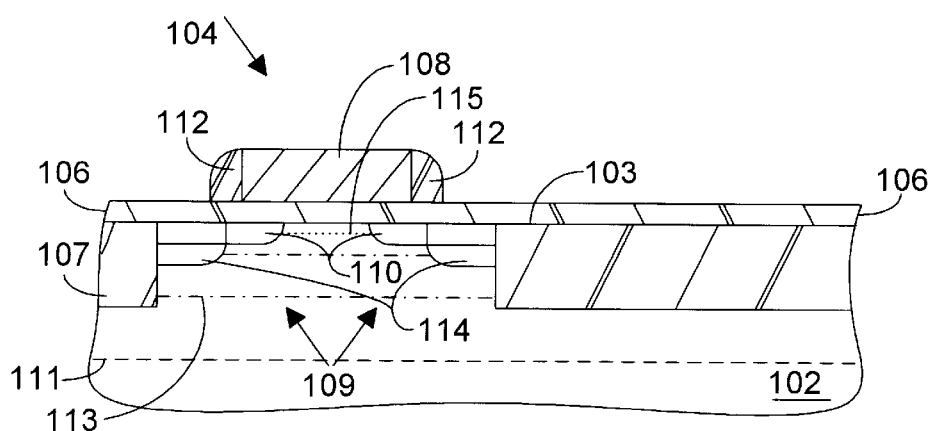
FIG. 3 is a partial cross-sectional view of a first transistor formed on a global substrate.

Turning now to FIGS. 3–10, the processing sequence for forming integrated circuit 100 in accordance with the present invention is disclosed. FIG. 3 shows first transistor 104 formed within global substrate 102. In one embodiment, global substrate 102 is doped with one or more substrate impurity distributions. For example, a first well distribution 111 may be introduced into global substrate 102 in an embodiment in which it is desirable to produce both p-channel and n-channel devices in global substrate 102. In such an embodiment, a well impurity distribution of the opposite conductivity type of well impurity distribution 111 will be introduced into those regions of global substrate 102 in which it is desired to produce first transistors 104 of the opposite channel type. Similarly, a first punchthrough impurity distribution 113 is shown in FIG. 3. A punchthrough impurity distribution can be incorporated into first transistor 104 to reduce sub-threshold currents due to punchthrough effects (see, S. Wolf, *Silicon Processing for the VLSI Era*-Vol. 2, Lattice Press, Sunset Beach, Calif. 1990). FIG. 3 further discloses a first adjust impurity distribution 115 introduced into global substrate 102 in a shallow (i.e., less than 0.2 microns) region below upper surface 102 of global substrate 103. Threshold adjust impurity distributions such as first adjust impurity distribution 115 are well known in the field to precisely control transistor threshold voltages. Each of the impurity distributions within global substrate 102 is preferably introduced into global substrate 102 with an ion implantation step (not shown in the drawing). In an n-channel embodiment of first transistor 104, first well impurity distribution 111 is a p-type impurity distribution preferably produced by the ion implantation of boron. The first punchthrough impurity distribution 113, in an n-channel embodiment of first transistor 104, is also of a p-type, such as is formed from a boron ion implantation. Finally, the first adjust impurity distribution 115 is typically designed to increase the absolute value of the threshold voltage for the n-channel embodiments and is, therefore, also of a p-type impurity such as boron. In a p-channel embodiment of first transistor 104, first well impurity distribution 111 is an n-type impurity such as phosphorous, or arsenic, the first punchthrough impurity distribution 113 is of an n-type impurity such as phosphorous or arsenic, while the adjust impurity distribution 115 may differ depending upon the conductivity type of the impurity used to dope first conductive gate structure 108. In an embodiment in which a p-type impurity such as boron is used to dope conductive gate structures 108 of the p-channel transistors 104, first adjust impurity distribution 115 preferably comprises boron.

After the various impurity distributions have been introduced into global substrate 102, a first conductive gate structure 106 is formed on upper surface 103 of global substrate 102. First gate dielectric 106 is preferably formed through the thermal oxidation of global substrate 102 such as is well known in the field. In the preferred embodiment, a thickness of first gate dielectric 106 is between approximately 20 and 200 angstroms. Subsequent to the formation of first gate dielectric 106, first conductive gate structure 108 is formed. The formation of conductive gate structure 108 is preferably accomplished by chemically vapor depositing polysilicon at low pressure (i.e. less than approximately 2.0 torrs). After the deposition of the polysilicon layer, the polysilicon film is typically doped, preferably though another ion implantation step, to produce a heavily doped polysilicon film. For purposes of this disclosure, heavily doped polysilicon is defined as polysilicon having a sheet resistivity of less than approximately 500 Ω/sq. The polysilicon film is then patterned according to well known photolithography and etch processing steps. Thereafter, the source/drain impurity distributions are introduced into global substrate 102. In the embodiment shown in FIG. 3 in which both lightly doped source/drain regions 110 and heavily doped source/drain regions 114 are present, the source/drain formation process includes the steps of implanting a lightly doped source/drain impurity distribution into lightly doped source/drain regions 110 of global substrate 102 (during which process first conductive gate structure 108 serves as the implant mask such that lightly doped source/drain impurity regions 110 are self-aligned with first conductive gate structure 108). Thereafter, spacer structures 112 are formed on side-walls of first conductive gate structure 108. The formation of spacer structures such as spacer structures 112 is accomplished by depositing a conformal dielectric film, typically a CVD TEOS oxide, and thereafter performing an anisotropic etch to remove portions of the conformal film from the planar or horizontal regions of the topography. After the formation of the spacer structures 112, a heavily doped source/drain impurity distribution is implanted into heavily doped source/drain regions 114 of global substrate 102. Ideally, the implant energy and dose used to introduce lightly doped source/drain impurity distributions into lightly doped drain regions 110 of global substrate 102 are less than the energy and dose used to introduce heavily doped source/drain impurity distributions into heavily doped source/drain regions 114 of global substrate 102. To electrically isolate first transistor 104 from other first transistors 104 (not shown in the drawings) formed on or within global substrate 102, isolation structures such as shallow trench isolation structure 107 are fabricated in conjunction with the formation of first transistor 104. Shallow trench isolation structures 107 may be optionally formed within global substrate 102 prior to the transistor formation process just described or, alternatively, after transistor formation. In either embodiment, the isolation formation process includes the steps of etching an isolation trench into global substrate 102, filling the trench with a dielectric material such as a CVD oxide, and removing the excess trench dielectric from regions exterior to the isolation trench with a planarization process such as chemical mechanical polish. It will be appreciated to those skilled in the art that alternative isolation structures exist and may be suitably incorporated in lieu of shallow trench isolation structure 107. For example, LOCOS isolation structures may be used to isolate individual first transistors 104 within global substrate 102. The formation of LOCOS isolation structures is accomplished by selectively oxidizing portions of global substrate 102, preferably through the use of a silicon nitride mask. After the selected portions of global substrate 102 have been thermally oxidized, the silicon nitride mask can be removed leaving behind the isolation structures.

Figure 4:
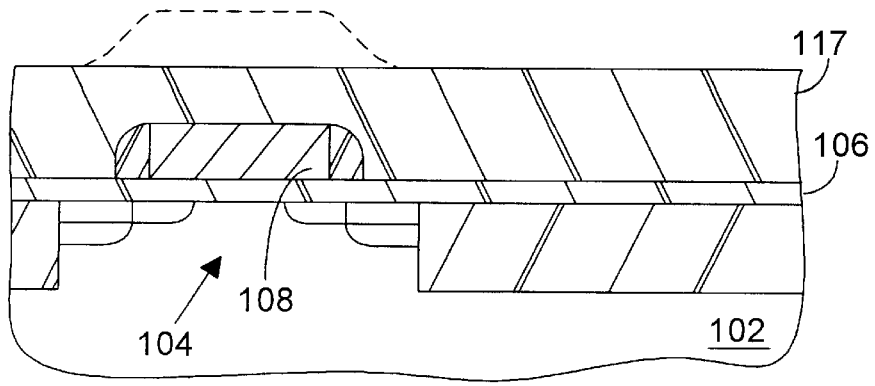
FIG. 4 depicts a processing step subsequent to FIG. 3, in which a first inter-substrate dielectric has been formed on a first conductive gate structure of the first transistor and the global substrate.

Turning to FIG. 4, a first inter-substrate dielectric layer 117 is formed upon first transistor 104 and global substrate 102. The formation of first inter-substrate dielectric 117 is preferably accomplished by blanket depositing an oxide layer over a topography defined by first transistor 104 and global substrate 102. The blanket deposition of the first inter-substrate dielectric 117 is preferably performed with a chemical vapor deposition process. After the deposition of inter-substrate dielectric 117, a planarization step such as a chemical mechanical polish is preferably performed to eliminate peaks (shown in phantom in the figure) from first inter-substrate dielectric 117 such that an upper surface of first inter-substrate dielectric 117 is substantially planar.

Figure 5:
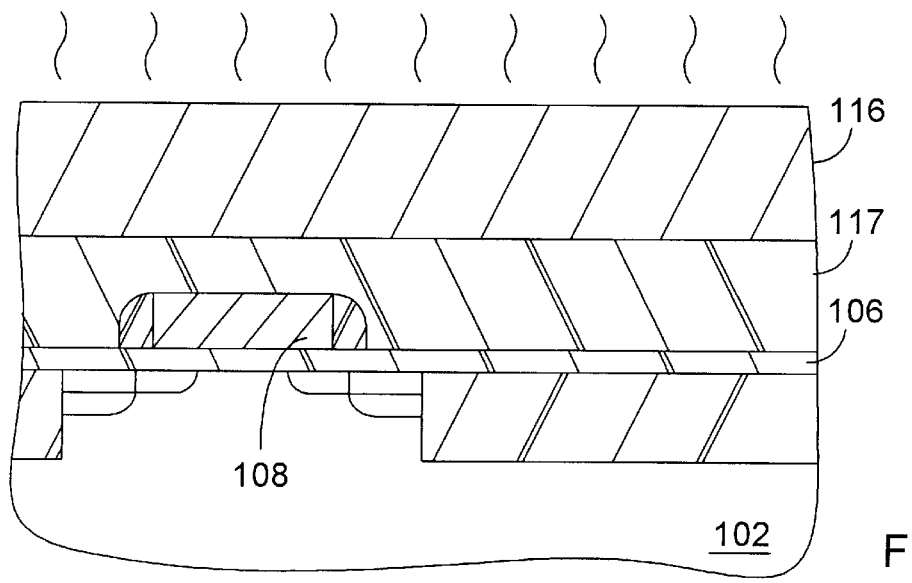
FIG. 5 depicts a processing step subsequent to FIG. 4 in which a first local substrate has been formed on the first inter-substrate dielectric and subjected to an anneal cycle.

In FIG. 5, first local substrate 116 is formed upon an upper surface of a first transistor level and, more specifically, upon an upper surface of first inter-substrate dielectric 117. In a presently preferred embodiment, first local substrate 116 is a semiconductor material preferably comprising large grain size polysilicon. As discussed previously, it is desirable to produce a polysilicon film in which the grain size is as large as possible such that the electrical characteristics of first local substrate 116 approximate the electrical characteristics of a single crystal silicon film. To accomplish this goal, the preferred embodiment of the first local substrate 116 formation process includes the steps of depositing a silicon bearing film upon inter-substrate 117 at a temperature less than approximately 580° C. at low pressure (i.e. less than approximately 2.0 torrs) in a chemical vapor deposition reactor such that the as deposited first local substrate 116 film comprises amorphous silicon. The amorphous silicon film is then subjected to a high temperature step such as a thermal anneal cycle at a temperature of approximately 400° to 1000° C. for a duration of approximately 2 to 24 hours. The recrystalization of an amorphous silicon film during a high temperature step results in the formation of a polysilicon film in which the average grain size is larger than the average grain size in polysilicon films deposited at an initial temperature of approximately 580° C. or greater. It is theorized that, by combining the deposition of an amorphous silicon film with a thermal anneal cycle, an average grain size of first local substrate 116 can approach 0.3 micron and greater. For sub-micron transistor applications, a grain size in this region may be sufficiently large such that first local substrate 116 approximates the electrical characteristics of a single crystal silicon film.

Figure 6:
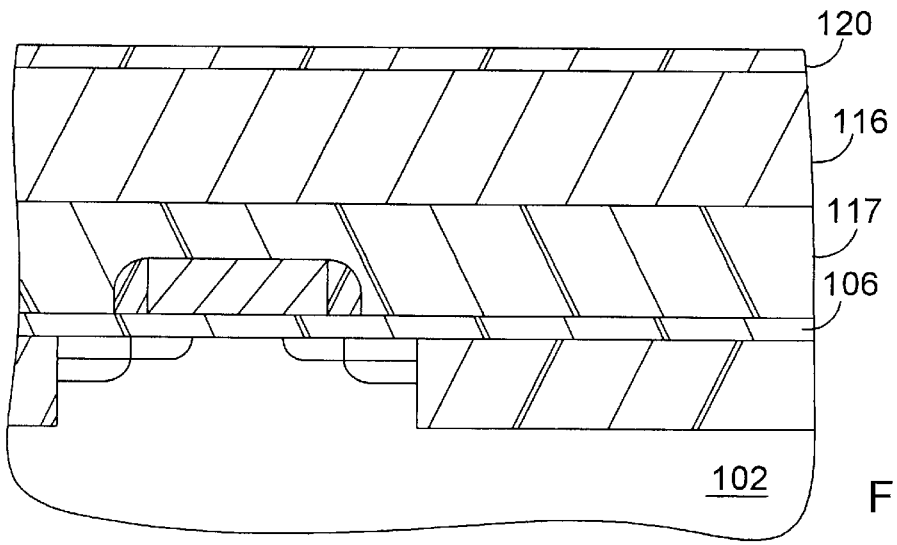
FIG. 6 depicts a processing step subsequent to FIG. 5 in which a second gate dielectric layer has been formed on an upper surface of the first local substrate.
Figure 7:
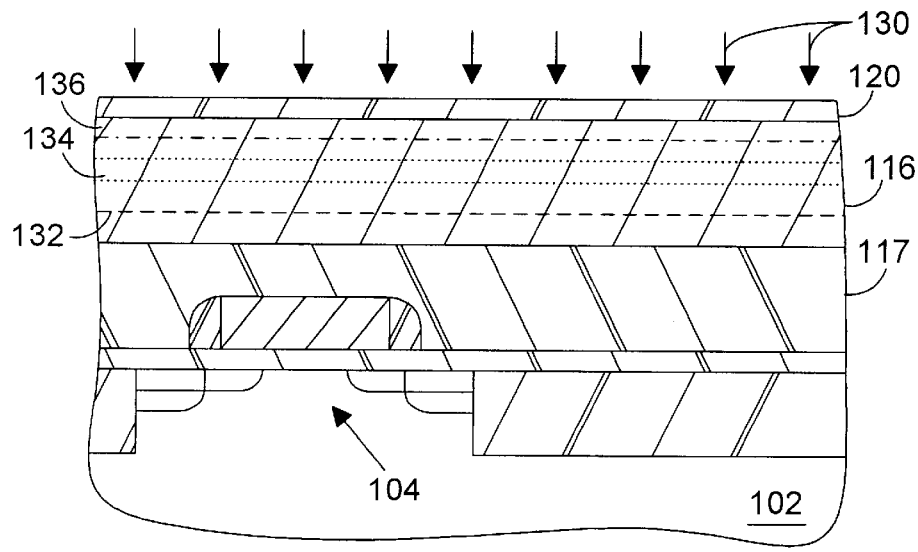
FIG. 7 depicts a processing step subsequent to FIG. 6 in which a well impurity distribution, a punchthrough impurity distribution, and a threshold adjust impurity distribution have been introduced into the first local substrate.

In FIG. 6, second gate dielectric layer 120 is formed on an upper surface of first local substrate 116. Similar in structure to first gate dielectric 106, second gate dielectric 120 is a thermal oxide film of approximately 20 to 200 angstroms in thickness. Turning now to FIG. 7, various impurity distributions analogous to the various impurity distributions introduced into global substrate 102 as discussed previously with respect to FIG. 3 are introduced into first local substrate 116. The introduction of the various impurity distributions into first local substrate 116 is preferably accomplished with ion implantation steps collectively represented in the figure as reference numeral 130. In the embodiment shown in FIG. 7, the various impurity distributions introduced into first local substrate 116 include a second well impurity distribution 132, a second punchthrough distribution 134, and a second adjust impurity distribution 136. As will be appreciated to those skilled in the art of semiconductor processing, each impurity distribution shown in FIG. 7 may be further divided into a p-channel impurity distribution and an n-channel impurity distribution in an embodiment in which it is desired to fabricate transistors of both conductivity types within first local substrate 116. In such an embodiment, the various impurity distributions are introduced into selected regions of first local substrate 116 through the use of conventional masking steps.

Figure 8:
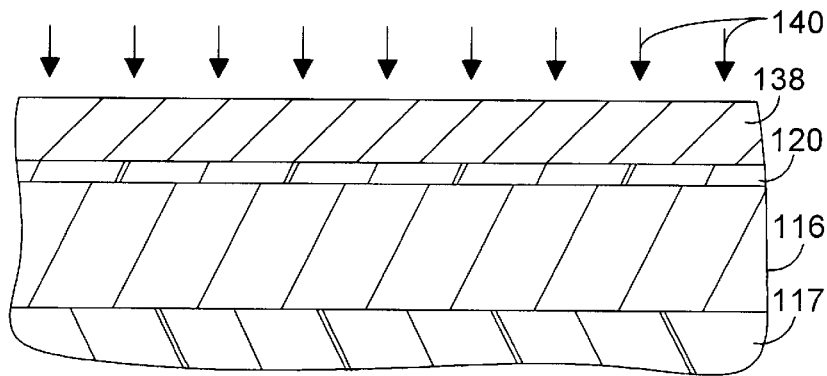
FIG. 8 depicts a processing step subsequent to FIG. 7 in which a second conductive gate layer has been formed on an upper surface of the second gate dielectric layer and doped with an ion implantation.

Turning now to FIG. 8, a conductive gate material 138 is formed on an upper surface of second gate dielectric 120. Preferably, conductive gate material 138 includes polysilicon that is chemically vapor deposited on second gate dielectric 120 at low pressure (i.e. less than approximately 2.0 torrs). Preferably, conductive gate material 138 has a sheet resistivity of less than approximately 500 Ω/sq. To achieve such a sheet resistivity in an embodiment in which second conductive gate layer 138 is polysilicon, an ion implantation step, represented in the drawing as reference numeral 140, is performed. In a CMOS embodiment, ion implantation step 140 may include two separate ion implantations—a first ion implantation introducing p-type impurities such as boron into regions of second conductive gate layer 138, in which p-channel transistors will be subsequently formed, and a second implantation used to introduce n-type impurities such as phosphorous or arsenic into n-channel regions. Alternatively, gate material 138 can be doped during its deposition.

Figure 9:
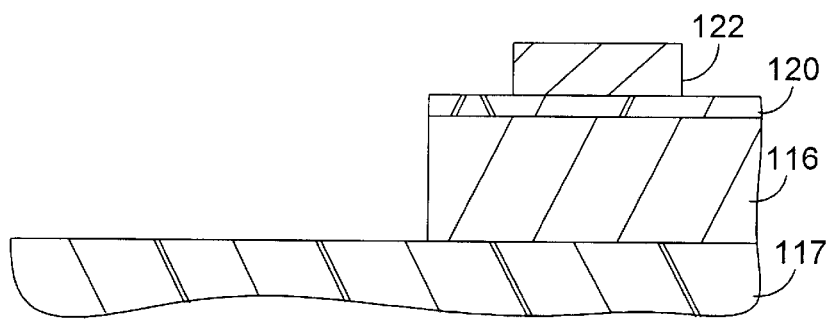
FIG. 9 depicts a processing step subsequent to FIG. 8 in which a second conductive gate structure has been patterned on the second gate dielectric layer.

In FIG. 9, second conductive gate layer 138 has been patterned to form second conductive gate structure 122. In addition, first local substrate 116 has been patterned to eliminate portions of first local substrate 116 over first transistor 104. The elimination of portions of first local substrate 116 over first transistor 104 is preferably accomplished to facilitate contacting the terminals of first transistor 104. It will be appreciated that the patterning of first local substrate 116 as shown in FIG. 9 may be performed prior to the implantation steps 130 shown in FIG. 7, prior to the deposition of the second conductive gate layer 138, or prior to the formation of second gate dielectric layer 120 as shown in FIG. 6.

Figure 10:
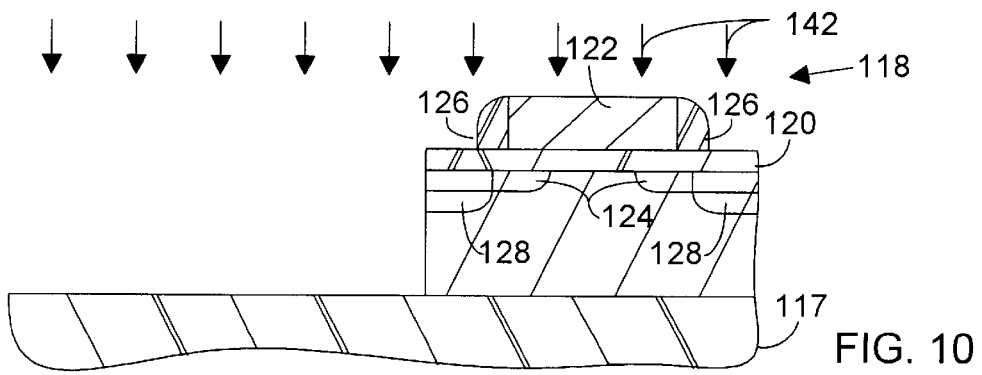
FIG. 10 depicts a processing step subsequent to FIG. 9 in which source/drain impurity distributions are introduced into the first local substrate to form the second transistor.

Turning, finally, to FIG. 10, second transistor 118 is fabricated by introducing impurities into the source/drain regions of first local substrate 116. In the embodiment shown in FIG. 10, a lightly doped impurity distribution 124 is introduced into first local substrate 116 with ion implantation step 142. Second conductive gate structure 122 serves as a self aligning mask during the formation of lightly doped source/drain impurity distributions 124. Thereafter, spacer structures 126 are formed on side walls of second conductive gate structure 122 and heavily doped source/drain distributions are introduced into first local substrate 116 through a second implantation represented by reference numeral 142.

It will be appreciated to those skilled in the art having the benefit of this disclosure that this invention is capable of substantially reducing or eliminating laterally formed isolation structures between a first transistor formed within a global substrate and a vertically displaced second transistor formed in a first local substrate. Moreover, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A local substrate for a multi-level integrated circuit, wherein said local substrate comprises polycrystalline silicon formed on a first transistor level of said integrated circuit, said polycrystalline silicon having an average grain size greater than approximately 3000 angstroms, and further wherein said local substrate is suitable for forming a second transistor level of said integrated circuit such that said second transistor level is vertically displaced with respect to said first transistor level.

2. The local substrate of claim 1 wherein said first transistor level includes a first transistor and an inter-substrate dielectric isolating said first transistor from said local substrate.

3. The local substrate of claim 2 wherein a thickness of said inter-substrate dielectric comprises an oxide, and wherein a thickness of said inter-substrate dielectric is approximately 0.5 to 15.0 microns.

4. The local substrate of claim 1 wherein a thickness of said local substrate is approximately 1 to 8 microns.

5. The local substrate of claim 1 wherein said local substrate further includes a second transistor formed upon said second transistor level such that said second transistor is vertically displaced from a first transistor formed upon said first transistor level.

6. The local substrate of claim 5 wherein a lateral separation between said first transistor and said second transistor is less than approximately 10% of a lateral dimension of said first transistor.

\* \* \* \* \*